US012604690B2

(12) United States Patent
Wang et al.

(10) Patent No.: US 12,604,690 B2
(45) Date of Patent: Apr. 14, 2026

(54) SYSTEMS AND METHODS FOR SELECTIVE METAL-CONTAINING HARDMASK REMOVAL

(71) Applicant: Applied Materials, Inc., Santa Clara, CA (US)

(72) Inventors: Baiwei Wang, Santa Clara, CA (US); Rohan Puligoru Reddy, San Jose, CA (US); Xiaolin C. Chen, San Ramon, CA (US); Wanxing Xu, Sunnyvale, CA (US); Zhenjiang Cui, San Jose, CA (US); Anchuan Wang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 276 days.

(21) Appl. No.: 18/244,583

(22) Filed: Sep. 11, 2023

(65) Prior Publication Data

US 2025/0087494 A1 Mar. 13, 2025

(51) Int. Cl.
*H01L 21/311* (2006.01)

(52) U.S. Cl.
CPC .............................. *H01L 21/31122* (2013.01)

(58) Field of Classification Search
None
See application file for complete search history.

(56) References Cited

U.S. PATENT DOCUMENTS

| | | | |
|---|---|---|---|
| 8,809,185 B1 | 8/2014 | Feurprier | |
| 11,062,897 B2 | 7/2021 | Yu et al. | |

| | | | | |
|---|---|---|---|---|
| 2016/0086815 A1* | 3/2016 | Pandit | ............... | H01L 21/32139 |
| | | | | 438/703 |
| 2016/0086816 A1 | 3/2016 | Wang et al. | | |
| 2018/0358220 A1* | 12/2018 | Yu | ...................... | H01L 21/02019 |
| 2019/0311909 A1* | 10/2019 | Bajaj | ................. | H01L 21/32135 |
| 2022/0351979 A1 | 11/2022 | Cui et al. | | |
| 2023/0118701 A1 | 4/2023 | Tan et al. | | |
| 2024/0112923 A1* | 4/2024 | Zhang | ............... | H01J 37/32862 |

FOREIGN PATENT DOCUMENTS

| | | | | |
|---|---|---|---|---|
| KR | 20230104689 A | 7/2023 | | |
| WO | WO-2022127813 A1 * | 6/2022 | ........ | H01J 37/32862 |

OTHER PUBLICATIONS

Sharma, et al., "Thermal Gas-phase Etching of Titanium Nitride (TiN) by Thionyl Chloride (SOC12)", Applied Surface Science, vol. 540, Part 1, Feb. 28, 2021, pp. 1-8.

(Continued)

*Primary Examiner* — Stephanie P Duclair

(74) *Attorney, Agent, or Firm* — Kilpatrick Townsend & Stockton LLP

(57) ABSTRACT

Exemplary semiconductor processing methods may include flowing an etchant precursor into a processing region of a semiconductor processing chamber. A substrate may be housed within the processing region. The substrate may define an exposed region of a metal-containing hardmask material and an exposed region of a material characterized by a dielectric constant of less than or about 4.0. The methods may include contacting the substrate with the etchant precursor. The methods may include removing at least a portion of the metal-containing hardmask material.

22 Claims, 5 Drawing Sheets

(56) References Cited

OTHER PUBLICATIONS

TW113134042, "Office Action", Mar. 4, 2025, 10 pages.
Application No. PCT/US2024/044707 , International Search Report
and Written Opinion, Mailed on Dec. 12, 2024, 11 pages.
Taiwanese Application No. 113134042, Notice of Decision to Grant
mailed on May 13, 2025, 4 pages (2 pages of English Translation
and 2 pages of original document).

\* cited by examiner

400

500

525

520

515

510

505

520

515

510

505

SYSTEMS AND METHODS FOR SELECTIVE METAL-CONTAINING HARDMASK REMOVAL

TECHNICAL FIELD

The present technology relates to semiconductor processes and equipment. More specifically, the present technology relates to selectively etching metal-containing hardmasks.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers, or thinning lateral dimensions of features already present on the surface. Often it is desirable to have an etch process that etches one material faster than another facilitating, for example, a pattern transfer process. Such an etch process is said to be selective to the first material. As a result of the diversity of materials, circuits, and processes, etch processes have been developed with a selectivity towards a variety of materials.

Etch processes may be termed wet or dry based on the materials used in the process. For example, a wet etch may preferentially remove some oxide dielectrics over other dielectrics and materials. However, wet processes may have difficulty penetrating some constrained trenches and also may sometimes deform the remaining material. Dry etches produced in local plasmas formed within the substrate processing region can penetrate more constrained trenches and exhibit less deformation of delicate remaining structures. However, local plasmas may damage the substrate through the production of electric arcs as they discharge.

Thus, there is a need for improved systems and methods that can be used to produce high quality devices and structures. These and other needs are addressed by the present technology.

SUMMARY

Exemplary semiconductor processing methods may include flowing an etchant precursor into a processing region of a semiconductor processing chamber. A substrate may be housed within the processing region. The substrate may define an exposed region of a metal-containing hardmask material and an exposed region of a material characterized by a dielectric constant of less than or about 4.0. The methods may include contacting the substrate with the etchant precursor. The methods may include removing at least a portion of the metal-containing hardmask material.

In some embodiments, the etchant precursor may be or include a halogen-containing precursor. The etchant precursor may be or include nitrogen trifluoride ($NF_3$), diatomic fluorine ($F_2$), diatomic chlorine ($Cl_2$), thionyl chloride ($SOCl_2$), carbon tetrafluoride ($CF_4$), hexafluoroethane ($C_2F_6$), sulfur hexafluoride ($SF_6$), carbon tetrachloride ($CCl_4$), dichloromethane ($CH_2Cl_2$), chloroform ($CHCl_3$), or a combination thereof. The methods may include flowing a hydrogen-containing precursor or an oxygen-containing precursor to the processing region of the semiconductor processing chamber with the etchant precursor. Removing the portion of the metal-containing hardmask material may be performed plasma-free. Removing the portion of the metal-containing hardmask material may be performed at a temperature greater than or about 350° C. Removing the portion of the metal-containing hardmask material may be performed at a pressure greater than or about 2 Torr. The methods may include, prior to flowing the etchant precursor into the processing region of the semiconductor processing chamber, removing an oxidized portion of the metal-containing hardmask material. The methods may include, subsequent to removing the portion of the metal-containing hardmask material, contacting the substrate with a second etchant precursor to remove fluorine-containing residue from the substrate or an oxidized portion of the metal-containing hardmask material.

Some embodiments of the present technology may encompass semiconductor processing methods. The methods may include flowing a pre-etching precursor into a processing region of a semiconductor processing chamber. A substrate may be housed within the processing region. The substrate may define an exposed region of a metal-containing hardmask material and an exposed region of a material characterized by a dielectric constant of less than or about 4.0. The methods may include contacting the substrate with the pre-etching precursor. The methods may include halting delivery of the pre-etching precursor. The methods may include flowing an etchant precursor into the processing region of the semiconductor processing chamber. The methods may include contacting the substrate with the etchant precursor. The methods may include selectively removing at least a portion of the metal-containing hardmask material relative to the material characterized by a dielectric constant of less than or about 4.0.

In some embodiments, the pre-etching precursor may be or include nitrogen trifluoride ($NF_3$), tungsten hexafluoride ($WF_6$), or boron trichloride ($BCl_3$). The methods may include forming plasma effluents of the pre-etching precursor. The etchant precursor may be or include nitrogen trifluoride ($NF_3$), diatomic fluorine ($F_2$), diatomic chlorine ($Cl_2$), thionyl chloride ($SOCl_2$), carbon tetrafluoride ($CF_4$), hexafluoroethane ($C_2F_6$), sulfur hexafluoride ($SF_6$), carbon tetrachloride ($CCl_4$), dichloromethane ($CH_2Cl_2$), chloroform ($CHCl_3$), or a combination thereof. Removing the portion of the metal-containing hardmask material may be performed plasma-free. The substrate may include an exposed region of a metal material. The method may include, prior to flowing the pre-etching precursor into the processing region of the semiconductor processing chamber, oxidizing the metal material.

Some embodiments of the present technology may encompass semiconductor processing methods. The methods may include flowing an etchant precursor into a processing region of a semiconductor processing chamber. A substrate may be housed within the processing region. The substrate may define an exposed region of a metal-containing hardmask material. The methods may include contacting the substrate with the etchant precursor. The methods may include removing at least a portion of the metal-containing hardmask material relative to one or more other materials on the substrate. The methods may include halting delivery of the etchant precursor. The methods may include flowing a post-etching precursor into the processing region of the semiconductor processing chamber. The methods may include contacting the substrate with the post-etching precursor. The methods may include removing a fluorine-containing residue from the substrate or an oxidized portion of the metal-containing hardmask material.

In some embodiments, the etchant precursor may be or include a halogen-containing precursor. The one or more other materials on the substrate may be or include a dielectric constant of less than or about 4.0, a metal material, a silicon-containing material, or a metal-and-oxygen-containing material. Removing the portion of the metal-containing hardmask material may be performed at a temperature greater than or about 350° C. and at a pressure greater than or about 2 Torr.

Such technology may provide numerous benefits over conventional systems and techniques. For example, the processes may allow dry etching to be performed that may protect features of the substrate. Additionally, the processes may selectively remove metal-containing hardmask materials relative to other exposed materials on the substrate. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
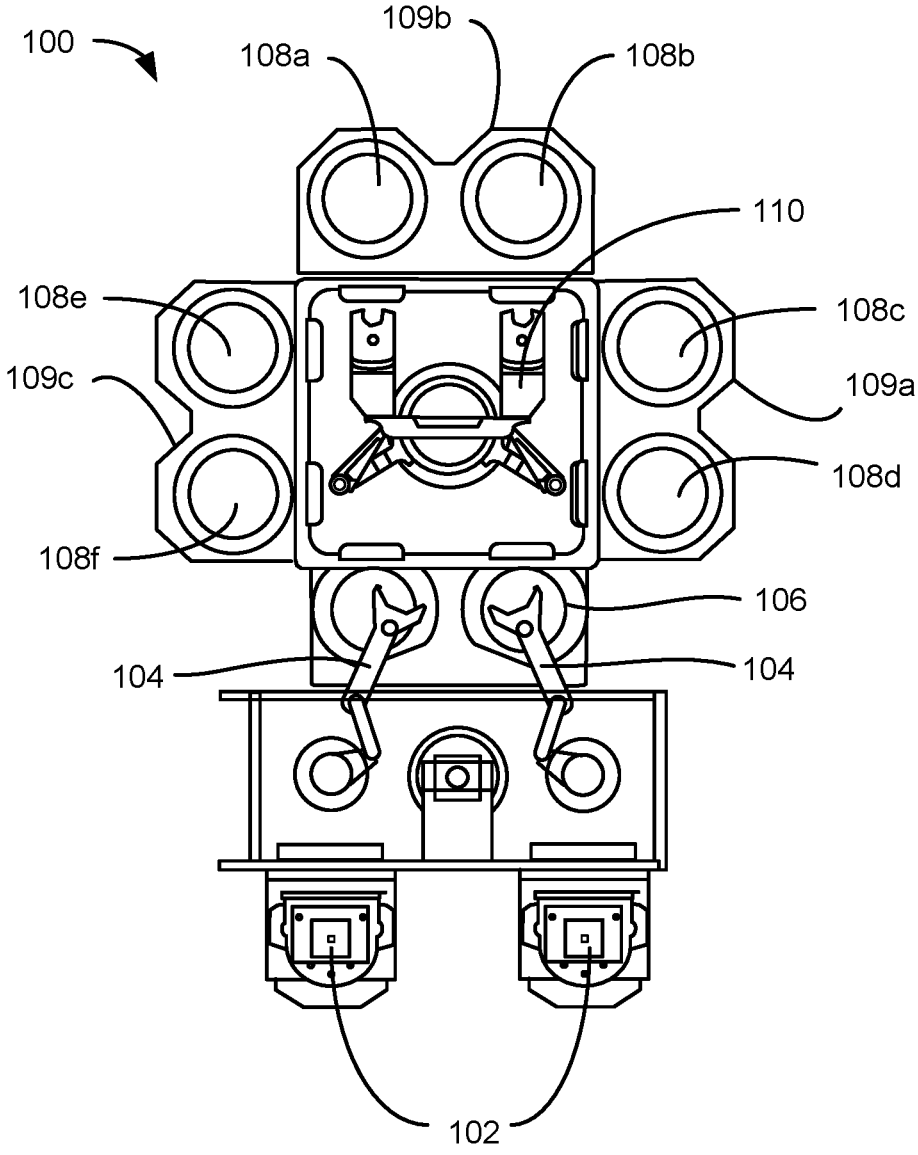
FIG. 1 shows a top plan view of one embodiment of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include additional or exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Diluted acids may be used in many different semiconductor processes for cleaning substrates and removing materials from those substrates. For example, diluted hydrofluoric acid ("dHF") can be an effective etchant for silicon oxide, aluminum oxide, titanium oxide, and other materials, and may be used to remove these materials from substrate surfaces. After the etching or cleaning operation is complete, the acid may be dried from the wafer or substrate surface. Using dHF may be termed a "wet" etch where the diluent is often water. Additional etching processes may be used that utilize precursors delivered to the substrate. For example, plasma-enhanced processes may also selectively etch materials by enhancing precursors through the plasma to perform a dry etch.

Although wet etchants using aqueous solutions or water-based processes may operate effectively for certain substrate structures, the water may pose challenges in a variety of conditions. For example, utilizing water during etch processes may cause issues when disposed on substrates including metal materials. For example, certain later fabrication processes, such as recessing gaps, removing oxide dielectric, or other processes to remove oxygen-containing materials, may be performed after an amount of metallization has been formed on a substrate. If water is utilized in some fashion during the etching, an electrolyte may be produced, which when contacting the metal material, may cause galvanic corrosion to occur between dissimilar metals, and the metal may be corroded or displaced in various processes. In addition, because of the surface tension of the water diluent, pattern deformation and collapse may occur with minute structures. The water-based material may also be incapable of penetrating some high aspect ratio features due to surface tension effects. Plasma etching may overcome the issues associated with water-based etching, although additional issues may occur. For example, a reactive ion etch process may expose the substrate to ion activity, which through bombardment can damage the structure, and affect electrical characteristics.

The present technology overcomes these issues by performing a dry etch process that may passivate a number of materials relative to a material to be etched, and in some embodiments a process may be plasma-free during the etching. By utilizing particular precursors that may facilitate halogen dissociation to provide etchant materials, an etch process may be performed that may protect the surrounding structures. Additionally, the materials and conditions used may allow improved etching relative to conventional techniques.

Although the remaining disclosure will routinely identify specific etching processes utilizing the disclosed technology, it will be readily understood that the systems and methods are equally applicable to deposition and cleaning processes as may occur in the described chambers, as well as other etching technology and other etching that may be performed with a variety of exposed materials that may be maintained or substantially maintained. Accordingly, the technology should not be considered to be so limited as for use with the exemplary etching processes or chambers alone. Moreover, although an exemplary chamber is described to provide foundation for the present technology, it is to be understood that the present technology can be applied to virtually any semiconductor processing chamber that may allow the operations described.

FIG. 1 shows a top plan view of one embodiment of a processing system 100 of deposition, etching, baking, and curing chambers according to embodiments. In the figure, a pair of front opening unified pods (FOUPs) 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including the dry etch processes described herein in addition to cyclical layer deposition (CLD), atomic layer deposition (ALD), chemical vapor deposition (CVD), physical vapor deposition (PVD), etch, pre-clean, degas, orientation, and other substrate processes.

The substrate processing chambers 108a-f may include one or more system components for depositing, annealing, curing and/or etching a dielectric film on the substrate wafer. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to etch a dielectric film on the substrate. Any one or more of the processes described may be carried out in chamber(s) separated from the fabrication system shown in different embodiments. It will be appreciated that additional configurations of deposition, etching, annealing, and curing chambers for dielectric films are contemplated by system 100.

Figure 2A:
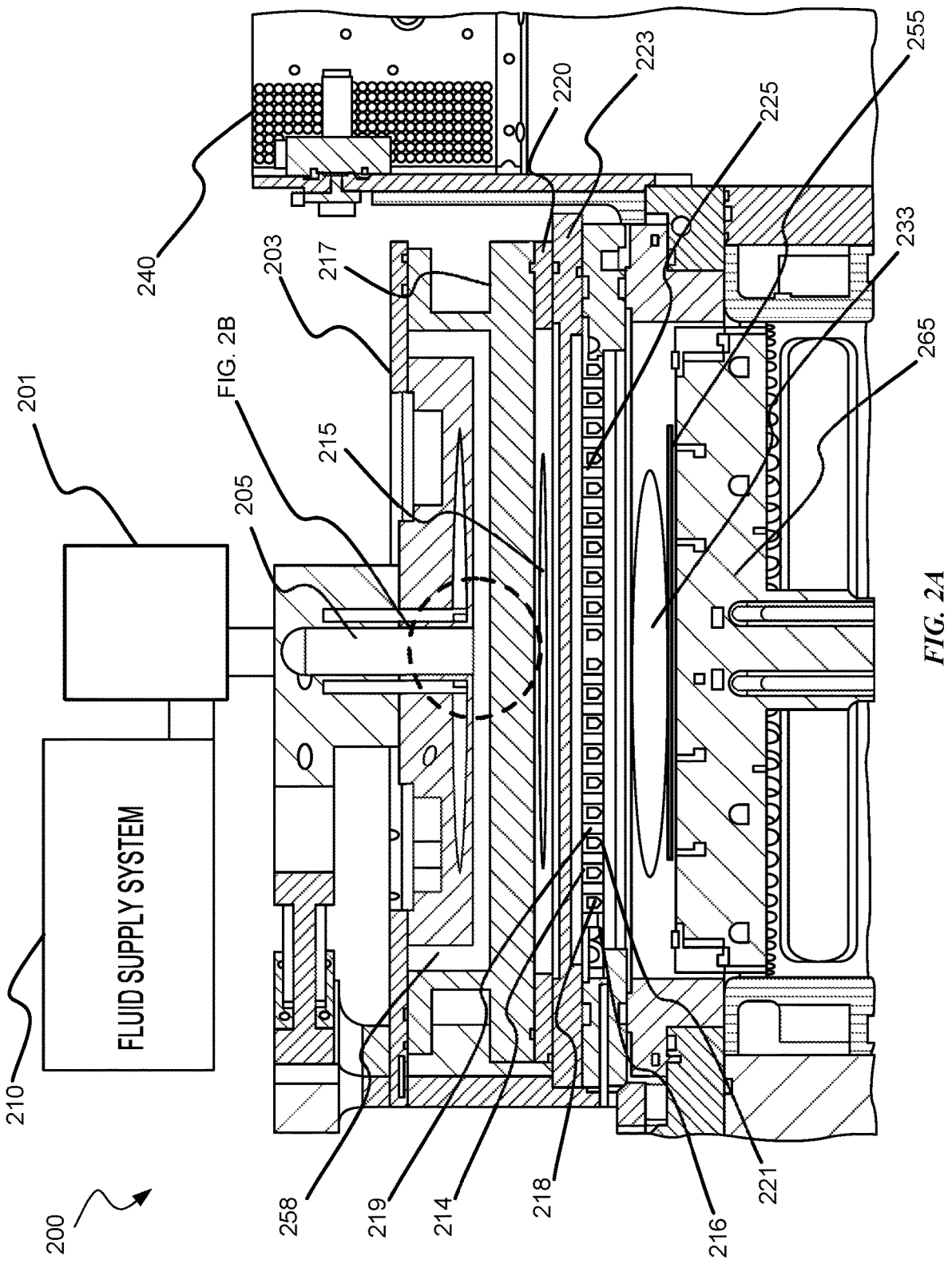
FIG. 2A shows a schematic cross-sectional view of an exemplary processing chamber according to some embodiments of the present technology.

FIG. 2A shows a cross-sectional view of an exemplary process chamber system 200 with partitioned plasma generation regions within the processing chamber. During film etching, e.g., titanium nitride (TiN), tungsten doped carbide (WDC), tantalum nitride (TaN), tungsten (W), silicon, poly-silicon, silicon oxide, silicon nitride, silicon oxynitride, silicon oxycarbide, etc., a process gas may be flowed into the first plasma region 215 through a gas inlet assembly 205. A remote plasma system (RPS) 201 may optionally be included in the system, and may process a first gas which then travels through gas inlet assembly 205. The inlet assembly 205 may include two or more distinct gas supply channels where the second channel (not shown) may bypass the RPS 201, if included.

A cooling plate 203, faceplate 217, ion suppressor 223, showerhead 225, and a pedestal 265 or substrate support, having a substrate 255 disposed thereon, are shown and may each be included according to embodiments. The pedestal 265 may have a heat exchange channel through which a heat exchange fluid flows to control the temperature of the substrate, which may be operated to heat and/or cool the substrate or wafer during processing operations. The wafer support platter of the pedestal 265, which may include aluminum, ceramic, or a combination thereof, may also be resistively heated in order to achieve relatively high temperatures, such as from up to or about 100° C. to above or about 1100° C., using an embedded resistive heater element.

The faceplate 217 may be pyramidal, conical, or of another similar structure with a narrow top portion expanding to a wide bottom portion. The faceplate 217 may additionally be flat as shown and include a plurality of through-channels used to distribute process gases. Plasma generating gases and/or plasma excited species, depending on use of the RPS 201, may pass through a plurality of holes, shown in FIG. 2B, in faceplate 217 for a more uniform delivery into the first plasma region 215.

Exemplary configurations may include having the gas inlet assembly 205 open into a gas supply region 258 partitioned from the first plasma region 215 by faceplate 217 so that the gases/species flow through the holes in the faceplate 217 into the first plasma region 215. Structural and operational features may be selected to prevent significant backflow of plasma from the first plasma region 215 back into the supply region 258, gas inlet assembly 205, and fluid supply system 210. The faceplate 217, or a conductive top portion of the chamber, and showerhead 225 are shown with an insulating ring 220 located between the features, which allows an AC potential to be applied to the faceplate 217 relative to showerhead 225 and/or ion suppressor 223. The insulating ring 220 may be positioned between the faceplate 217 and the showerhead 225 and/or ion suppressor 223 enabling a capacitively coupled plasma (CCP) to be formed in the first plasma region. A baffle (not shown) may additionally be located in the first plasma region 215, or otherwise coupled with gas inlet assembly 205, to affect the flow of fluid into the region through gas inlet assembly 205.

The ion suppressor 223 may comprise a plate or other geometry that defines a plurality of apertures throughout the structure that are configured to suppress the migration of ionically-charged species out of the first plasma region 215 while allowing uncharged neutral or radical species to pass through the ion suppressor 223 into an activated gas delivery region between the suppressor and the showerhead. In embodiments, the ion suppressor 223 may comprise a perforated plate with a variety of aperture configurations. These uncharged species may include highly reactive species that are transported with less reactive carrier gas through the apertures. As noted above, the migration of ionic species through the holes may be reduced, and in some instances completely suppressed. Controlling the amount of ionic species passing through the ion suppressor 223 may advantageously provide increased control over the gas mixture brought into contact with the underlying wafer substrate, which in turn may increase control of the deposition and/or etch characteristics of the gas mixture. For example, adjustments in the ion concentration of the gas mixture can significantly alter its etch selectivity. In alternative embodiments in which deposition is performed, it can also shift the balance of conformal-to-flowable style depositions for dielectric materials.

The plurality of apertures in the ion suppressor 223 may be configured to control the passage of the activated gas, i.e., the ionic, radical, and/or neutral species, through the ion suppressor 223. For example, the aspect ratio of the holes, or the hole diameter to length, and/or the geometry of the holes may be controlled so that the flow of ionically-charged species in the activated gas passing through the ion suppressor 223 is reduced. The holes in the ion suppressor 223 may include a tapered portion that faces the first plasma region 215, and a cylindrical portion that faces the showerhead 225. The cylindrical portion may be shaped and dimensioned to control the flow of ionic species passing to the showerhead 225. An adjustable electrical bias may also be applied to the ion suppressor 223 as an additional means to control the flow of ionic species through the suppressor.

The ion suppressor 223 may function to reduce or eliminate the amount of ionically charged species traveling from the plasma generation region to the substrate. Uncharged neutral and radical species may still pass through the openings in the ion suppressor to react with the substrate. It should be noted that the complete elimination of ionically charged species in the reaction region surrounding the substrate may not be performed in embodiments. In certain instances, ionic species are intended to reach the substrate in order to perform the etch and/or deposition process. In these instances, the ion suppressor may help to control the concentration of ionic species in the reaction region at a level that assists the process.

Showerhead 225 in combination with ion suppressor 223 may allow a plasma present in first plasma region 215 to avoid directly exciting gases in substrate processing region 233, while still allowing excited species to travel from first plasma region 215 into substrate processing region 233. In this way, the chamber may be configured to prevent the plasma from contacting a substrate 255 being etched. This may advantageously protect a variety of intricate structures and films patterned on the substrate, which may be damaged, dislocated, or otherwise warped if directly contacted by a generated plasma. Additionally, when plasma is allowed to contact the substrate or approach the substrate level, the rate at which oxide species etch may increase. Accordingly, if an exposed region of material is oxide, this material may be further protected by maintaining the plasma remotely from the substrate.

The processing system may further include a power supply 240 electrically coupled with the processing chamber to provide electric power to the faceplate 217, ion suppressor 223, showerhead 225, and/or pedestal 265 to generate a plasma in the first plasma region 215 or processing region 233. The power supply may be configured to deliver an adjustable amount of power to the chamber depending on the process performed. Such a configuration may allow for a tunable plasma to be used in the processes being performed. Unlike a remote plasma unit, which is often presented with on or off functionality, a tunable plasma may be configured to deliver a specific amount of power to the first plasma region 215. This in turn may allow development of particular plasma characteristics such that precursors may be dissociated in specific ways to enhance the etching profiles produced by these precursors.

A plasma may be ignited either in first plasma region 215 above showerhead 225 or substrate processing region 233 below showerhead 225. Plasma may be present in chamber plasma region 215 to produce the radical precursors from an inflow of, for example, a fluorine-containing precursor or other precursor. An AC voltage typically in the radio frequency (RF) range may be applied between the conductive top portion of the processing chamber, such as faceplate 217, and showerhead 225 and/or ion suppressor 223 to ignite a plasma in chamber plasma region 215 during deposition. An RF power supply may generate a high RF frequency of 13.56 MHz but may also generate other frequencies alone or in combination with the 13.56 MHz frequency.

Figure 2B:
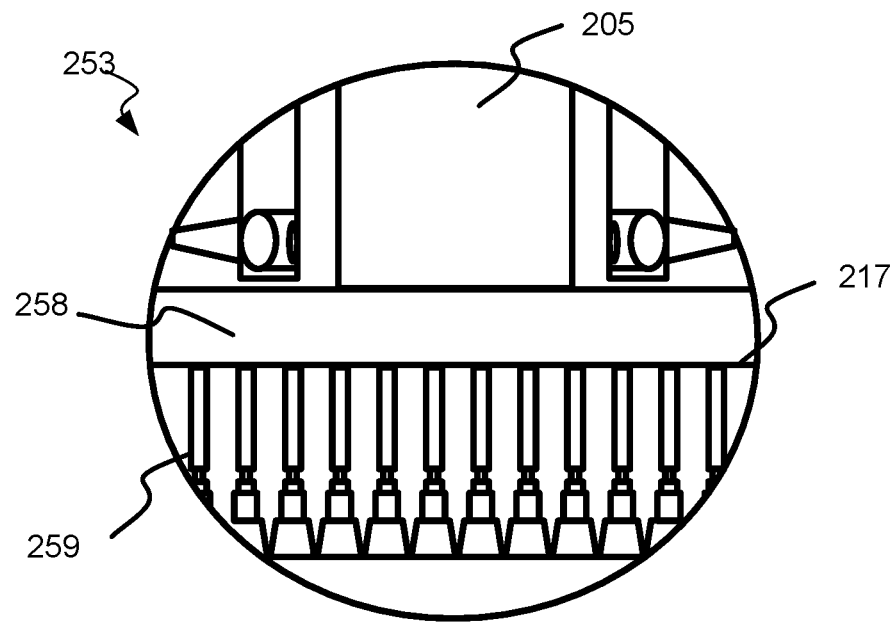
FIG. 2B shows a detailed view of a portion of the processing chamber illustrated in FIG. 2A according to some embodiments of the present technology.

FIG. 2B shows a detailed view 253 of the features affecting the processing gas distribution through faceplate 217. As shown in FIGS. 2A and 2B, faceplate 217, cooling plate 203, and gas inlet assembly 205 intersect to define a gas supply region 258 into which process gases may be delivered from gas inlet assembly 205. The gases may fill the gas supply region 258 and flow to first plasma region 215 through apertures 259 in faceplate 217. The apertures 259 may be configured to direct flow in a substantially unidirectional manner such that process gases may flow into processing region 233, but may be partially or fully prevented from backflow into the gas supply region 258 after traversing the faceplate 217.

Figure 3:
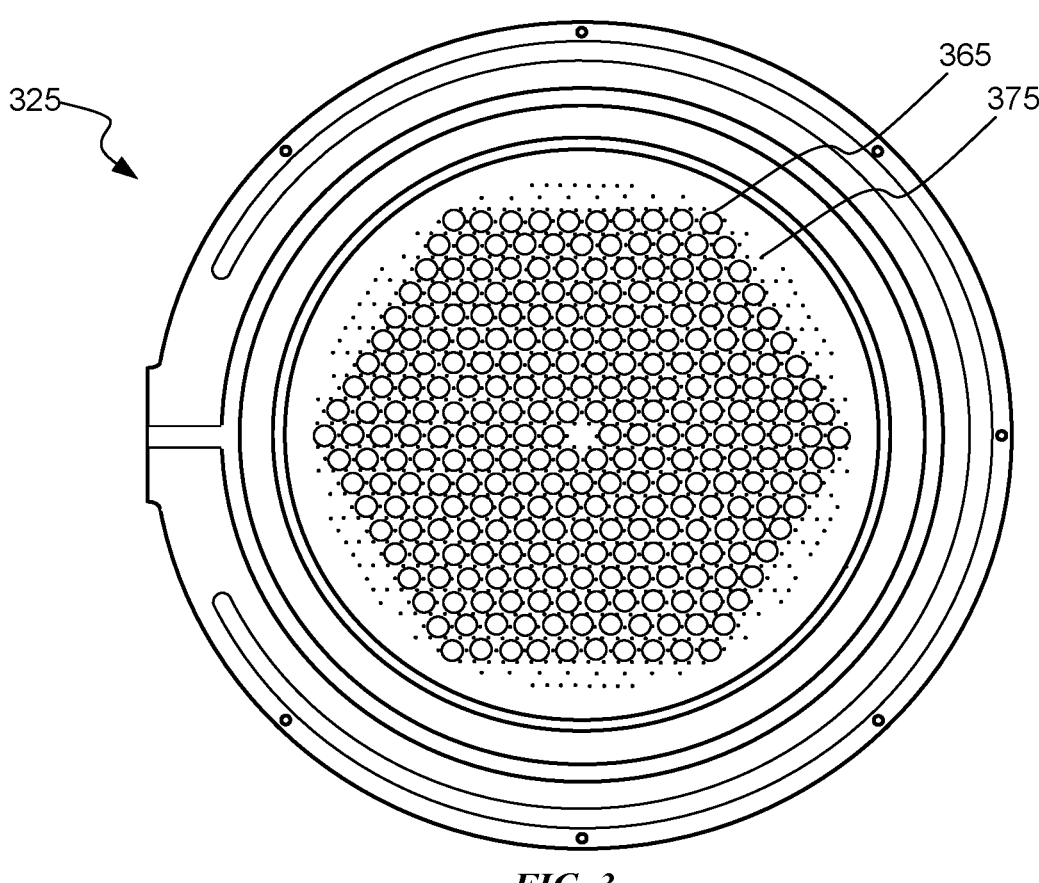
FIG. 3 shows a bottom plan view of an exemplary showerhead according to some embodiments of the present technology.

The gas distribution assemblies such as showerhead 225 for use in the processing chamber system 200 may be referred to as dual channel showerheads (DCSH) and are additionally detailed in the embodiments described in FIG. 3. The dual channel showerhead may provide for etching processes that allow for separation of etchants outside of the processing region 233 to provide limited interaction with chamber components and each other prior to being delivered into the processing region.

The showerhead 225 may comprise an upper plate 214 and a lower plate 216. The plates may be coupled with one another to define a volume 218 between the plates. The coupling of the plates may be so as to provide first fluid channels 219 through the upper and lower plates, and second fluid channels 221 through the lower plate 216. The formed channels may be configured to provide fluid access from the volume 218 through the lower plate 216 via second fluid channels 221 alone, and the first fluid channels 219 may be fluidly isolated from the volume 218 between the plates and the second fluid channels 221. The volume 218 may be fluidly accessible through a side of the showerhead 225.

FIG. 3 is a bottom view of a showerhead 325 for use with a processing chamber according to embodiments. Showerhead 325 may correspond with the showerhead 225 shown in FIG. 2A. Through-holes 365, which show a view of first fluid channels 219, may have a plurality of shapes and configurations in order to control and affect the flow of precursors through the showerhead 225. Small holes 375, which show a view of second fluid channels 221, may be distributed substantially evenly over the surface of the showerhead, even amongst the through-holes 365, and may help to provide more even mixing of the precursors as they exit the showerhead than other configurations.

Figure 4:
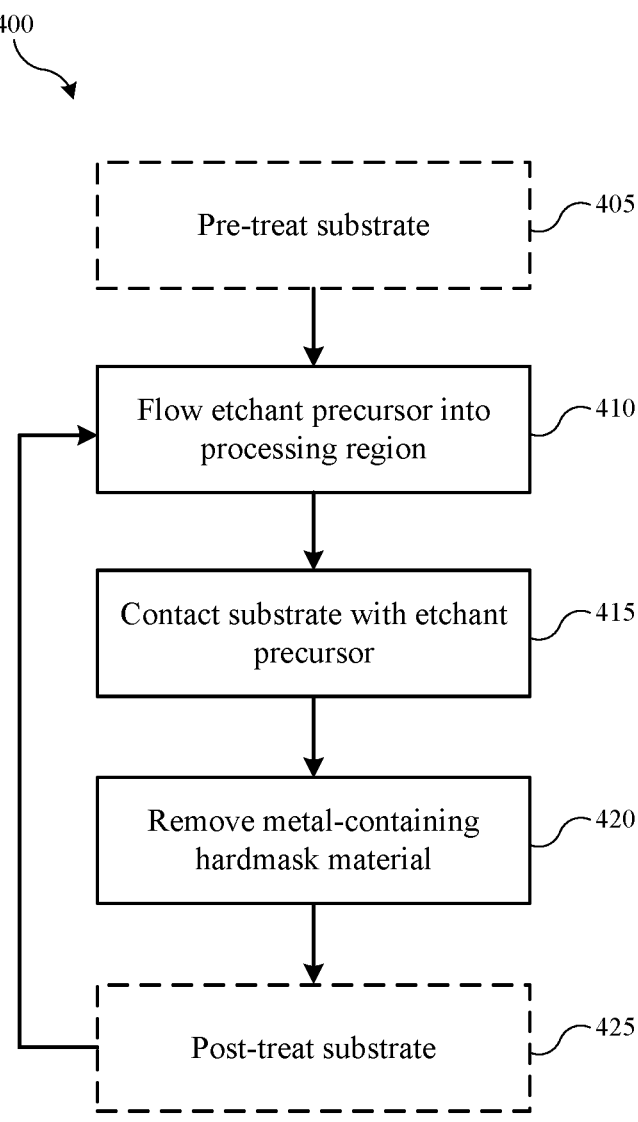
FIG. 4 shows exemplary operations in a method according to some embodiments of the present technology.

The chamber discussed previously may be used in performing exemplary methods including etching methods. Turning to FIG. 4 is shown exemplary operations in a method 400 according to embodiments of the present technology. Method 400 may include one or more operations prior to the initiation of the method, including front end processing, deposition, gate formation, etching, polishing, cleaning, or any other operations that may be performed prior to the described operations. The method may include a number of optional operations, which may or may not be specifically associated with some embodiments of methods according to the present technology. For example, many of the operations are described in order to provide a broader scope of the processes performed, but are not critical to the technology, or may be performed by alternative methodology as will be discussed further below. Method 400 may describe operations shown schematically in FIGS. 5A-5B, the illustrations of which will be described in conjunction with the operations of method 400. It is to be understood that the figures illustrate only partial schematic views, and a substrate may contain any number of additional materials and features having a variety of characteristics and aspects as illustrated in the figures.

Figure 5A:
FIGS. 5A-5B show schematic cross-sectional views of materials etched according to some embodiments of the present technology.
Figure 5A:
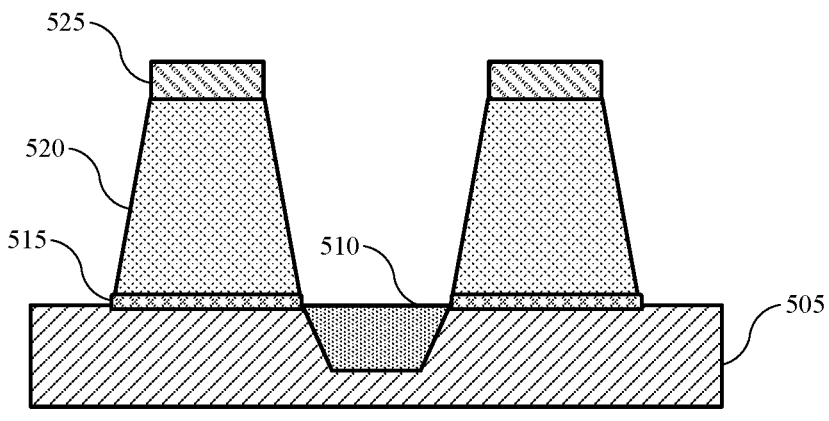

Method 400 may or may not involve optional operations to develop the semiconductor structure to a particular fabrication operation. It is to be understood that method 400 may be performed on any number of semiconductor structures or substrates 505, as illustrated in FIG. 5A, including exemplary structures on which a metal-containing hardmask removal operation may be performed. Exemplary semiconductor structures may include a trench, via, or other recessed features that may include one or more exposed materials. For example, an exemplary substrate may contain silicon or some other semiconductor substrate material as well as interlayer dielectric materials through which a recess, trench, via, or isolation structure may be formed. Exposed materials at any time during the etch process may be or include metal materials such as for a gate, a dielectric material, a contact material, a transistor material, or any other material that may be used in semiconductor processes. As shown in FIG. 5A, in some embodiments, exemplary structures 500 may include a metal-containing region 510, such as a tungsten-containing material, extending into the substrate 505. An aluminum-containing material 515 may overly portions of the substrate 505. Low dielectric constant material 520 characterized by a dielectric constant of less than or about 4.0, such as silicon oxide, may extend from the aluminum-containing material 515. In embodiments, the low dielectric constant material 520 may be characterized by a dielectric constant of less than or about 3.9, and may be less than or about 3.8, less than or about 3.7, less than or about 3.6, less than or about 3.5, less than or about 3.0, less than or about 2.5, or less. A metal-containing hardmask material 525, such as titanium nitride (TiN) or tungsten doped carbide (WDC), may overly the low dielectric constant material 520. Other metal-containing hardmask materials 525 may be or include tungsten, molybdenum, or tantalum, including nitrides, oxides, carbides, and silicides thereof. The metal-containing hardmask material 525 may be exposed relative to one or more other materials including metal-containing materials, dielectric materials including silicon oxide or silicon nitride, or any number of other semiconductor materials relative to which the metal-containing hardmask material 525 is to be removed, such as an oxide of aluminum and any other materials.

It is to be understood that the noted structure is not intended to be limiting, and any of a variety of other semiconductor structures including metal-containing hardmask materials, such as titanium-containing hardmask materials, are similarly encompassed. Other exemplary structures may include two-dimensional and three-dimensional structures common in semiconductor manufacturing, and within which a metal-containing hardmask material, such as a titanium-containing hardmask material (e.g., titanium nitride (TiN) or tungsten doped carbide (WDC)) is to be removed relative to one or more other materials, as the present technology may selectively remove metal-containing hardmask materials relative to other exposed materials, such as silicon-containing materials (e.g., amorphous, polycrystalline, or epitaxial), silicon-and-germanium-containing materials, other metal-containing materials such as non-hardmask metal-containing materials or metal-and-oxygen-containing materials, oxides including high dielectric constant oxides, and nitrides, as well as any of the other materials discussed elsewhere. Additionally, although a high-aspect-ratio structure may benefit from the present technology, the technology may be equally applicable to lower aspect ratios and any other structures.

For example, layers of material according to the present technology may be characterized by any aspect ratios or the height-to-width ratio of the structure, although in some embodiments the materials may be characterized by larger aspect ratios, which may not allow sufficient etching utilizing conventional technology or methodology. For example, in some embodiments the aspect ratio of any layer of an exemplary structure may be greater than or about 10:1, greater than or about 20:1, greater than or about 30:1, greater than or about 40:1, greater than or about 50:1, or greater. Additionally, each layer may be characterized by a reduced width or thickness less than or about 100 nm, less than or about 80 nm, less than or about 60 nm, less than or about 50 nm, less than or about 40 nm, less than or about 30 nm, less than or about 20 nm, less than or about 10 nm, less than or about 5 nm, less than or about 1 nm, or less, including any fraction of any of the stated numbers, such as 20.5 nm, 1.5 nm, etc. This combination of high aspect ratios and minimal thicknesses may frustrate many conventional etching operations, or require substantially longer etch times to remove a layer, along a vertical or horizontal distance through a confined width. Moreover, damage to or removal of other exposed layers may occur with conventional technologies as well.

Method 400 may be performed to remove an exposed metal-containing hardmask material, such as a titanium-containing material, in embodiments, in any number of structures in embodiments of the present technology. The methods may include specific operations for the removal of metal-containing hardmask materials, and may include one or more optional operations to prepare or treat the metal-containing hardmask materials or other exposed materials prior to removal of metal-containing hardmask materials. For example, an exemplary substrate structure including a titanium-containing material may have previous processing residues on a film to be removed, such as titanium nitride (TiN) or tungsten doped carbide (WDC). For example, residual photoresist or byproducts from previous processing may reside on the titanium nitride (TiN) or tungsten doped carbide (WDC) layer. These materials may prevent access to the titanium nitride (TiN) or tungsten doped carbide (WDC), or may interact with etchants differently than a clean titanium nitride (TiN) or tungsten doped carbide (WDC) surface, which may frustrate one or more aspects of the etching. Accordingly, in some embodiments an optional pre-treatment of the titanium-containing film or material may occur at optional operation 405. Exemplary pre-treatment operations may include a thermal treatment, wet treatment, or plasma treatment, for example, which may be performed in chamber system 200 as well as any number of chambers that may be included on system 100 described above. Method 400 may include one or more pre-treatment operations at optional operation 405.

In some pre-treatment operations at optional operation 405, a passivation material may be formed on the substrate 505. For example, a thermal oxidation may be performed. The thermal oxidation may include providing one or more pre-etching precursors, such as an oxygen-containing precursor (e.g., diatomic oxygen ($O_2$)), to the processing region. The substrate 505 may be contacted with the oxygen-containing precursor. The contacting may oxidize a portion of an exposed metal material, such as metal-containing region 510. The oxidized portion of the exposed metal material, such as metal-containing region 510, may serve to passivate the metal-containing region 510 during subsequent etching of the metal-containing hardmask material 525. Additionally or alternatively, optional operation 405 may include a selective deposition operation to deposit passivation material on one or more exposed surfaces of the substrate 505. The pre-etching precursors may include one or more deposition precursors may be provided to the processing region and may contact the substrate 505. In embodiments, depending on the passivation material to be deposited, a silicon-containing precursor may be provided to the processing region. For example, a silicon-containing material, such as silicon, may be deposited on the substrate 505.

In additional pre-treatment operations at optional operation 405, an oxygen-containing material, such as an oxidized portion of the metal-containing hardmask material 525, may be removed from the substrate 505. The oxidized portion of the metal-containing hardmask material 525 may be a surface oxide that may be present from exposure to ambient conditions. Removing the oxidized portion of the metal-containing hardmask material 525 may include providing one or more pre-etching precursors to the processing region, such as a fluorine-containing precursor, a chlorine-containing precursor, and/or a hydrogen-containing precursor. The precursors may be, for example, nitrogen trifluoride ($NF_3$) and diatomic hydrogen ($H_2$), tungsten hexafluoride ($WF_6$), and/or boron trichloride ($BCl_3$). The pre-treatment operations may then include contacting the substrate with the pre-etching precursors to remove oxygen-containing material, such as the oxidized portion of the metal-containing hardmask material 525. This removal may then allow the metal-containing hardmask material 525 to be removed during the subsequent etch.

In some embodiments, plasma effluents may be formed from the pre-etching precursors. A remote or local plasma may be developed from the pre-etching precursors intended to interact with residues in one or more ways. For example, utilizing chambers such as chamber system 200 described above, either a remote or local plasma may be produced from one or more pre-etching precursors. The plasma effluents may be flowed to the substrate, and may contact the residue material. The plasma effluents may be formed at a relatively low level plasma power to minimize damage to low dielectric constant materials on the substrate 505. For example, the plasma effluents may be formed at less than or about 500 W, and may be formed at less than or about 450 W, less than or about 400 W, less than or about 350 W, less than or about 300 W, less than or about 250 W, less than or about 200 W, less than or about 150 W, less than or about 100 W, less than or about 50 W, or less. In plasma-enhanced embodiments, the duration may be controlled to minimize damage to other material on the substrate 505. For example, the containing may proceed for less than or about 45 seconds, and may proceed for less than or about 40 seconds, less than or about 35 seconds, less than or about 30 seconds, less than or about 25 seconds, less than or about 20 seconds, less than or about 15 seconds, less than or about 10 seconds, less than or about 5 seconds, or less. After the duration of the contacting, the plasma may be extinguished, and the precursors/byproducts purged from the processing region. While plasma effluents may be formed in some embodiments, it is also contemplated that the pre-treatment operations at optional operation 405 be performed plasma-free to minimize damage to the substrate 505.

Figure 5B:
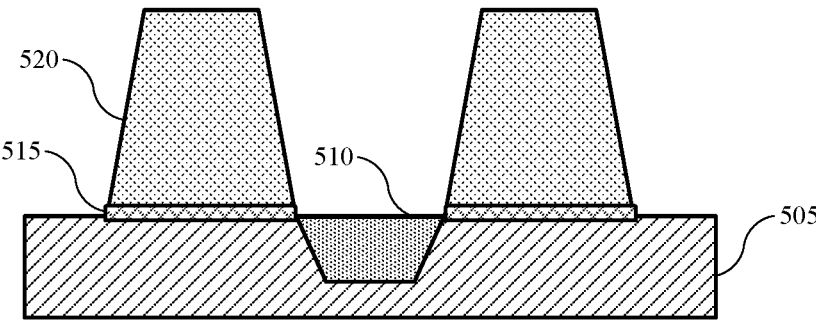

Method 400 may include flowing an etchant precursor into the substrate processing region of a semiconductor processing chamber housing the described substrate, or some other substrate, at operation 410. The etchant precursor may be flowed after halting delivery of the pre-etching precursor provided at optional operation 405. The etchant precursor may be flowed through a remote plasma region of the processing chamber, such as region 215 described above, although in some embodiments method 400 may not utilize plasma effluents during the etching operations. For example, method 400 may flow the etchant precursor to the processing region and the substrate 505 without exposing the precursor to a plasma, and may perform the removal of the metal-containing hardmask material without production of plasma effluents. The etchant precursor may contact the substrate 505 including the exposed region of metal-containing hardmask material 525, and may produce a halogenated material, which may remain on the substrate 505 or may volatize. The halogen-containing precursor may donate one or more halogen atoms, while accepting one or more nitrogen atoms in some embodiments. Some halogen-containing precursors may provide halogen radicals, while other plasma radicals may accept nitrogen from the film. Accordingly, the etchant precursor may etch or remove the metal-containing hardmask material at operation 415, as shown in FIG. 5B.

As noted above, the present technology may be performed without plasma development during the etching operations 410-415. By utilizing particular precursors, and performing the etching within certain process conditions, a plasma-free removal may be performed, and the removal may also be a dry etch. Accordingly, techniques according to aspects of the present technology may be performed to remove metal-containing hardmask material 525, such as titanium nitride (TiN) or tungsten doped carbide (WDC) from narrow features, as well as high aspect ratio features, and thin dimensions that may otherwise be unsuitable for wet etching. An optional operation may be performed to clear the substrate or chamber of residues and may include a post-treatment at optional operation 420. The post-treatment may include similar operations as the pre-treatment, and may include any of the precursors or operations discussed above for the pre-treatment. The post-treatment may clear residual etchant material, such as fluorine or chlorine, from the substrate 505 or semiconductor processing chamber in some embodiments. It is to be understood that although the pre-treatment and/or post-treatment operations may include plasma generation and plasma effluent delivery to the substrate, plasma may not be formed during the etching operations 410-415. For example, in some embodiments no plasma may be generated while the etchant precursor or precursors are being delivered into the processing chamber.

The etchant precursor during the etching operations 410-415 may include a halogen-containing precursor, and may include one or more of fluorine or chlorine in some embodiments. The specific precursors may be based on bonding or stability of the precursors. An exemplary etchant precursor may include nitrogen trifluoride ($NF_3$), as well as halogen-containing precursors such as other fluorine-containing precursors or chlorine-containing precursors. Other etchant precursors may include diatomic fluorine ($F_2$), diatomic chlorine ($Cl_2$), thionyl chloride ($SOCl_2$), carbon tetrafluoride ($CF_4$), hexafluoroethane ($C_2F_6$), sulfur hexafluoride ($SF_6$), carbon tetrachloride ($CCl_4$), dichloromethane ($CH_2Cl_2$), chloroform ($CHCl_3$), or a combination thereof. The etchant may also be flown together with a variety of other precursors. In some embodiments, in addition to the etchant precursor, a secondary precursor may be provided to increase selectivity and/or etch rate. The secondary precursor may be or include a hydrogen-containing precursor, such as a hydrocarbon, or an oxygen-containing precursor. Exemplary secondary precursors may be, for example, diatomic hydrogen ($H_2$), methane ($CH_4$), amines such as ammonia ($NH_3$), and/or diatomic oxygen ($O_2$). The etchant precursor and/or secondary precursor may also be provided with any number of carrier gases, which may include nitrogen, helium, argon, or other noble, inert, or useful precursors. The carrier gases may serve to dilute the etchant precursor, which may control etch rate, as well as distribute the etchant precursor.

The secondary precursor may help limit or reduce etching or etch rates of other exposed regions on the substrate, such as the metal-containing region 510. For example, the etchant precursor and the secondary precursor may interact with both the metal-containing hardmask material 525 and the metal-containing region 510. Without the secondary precursor, which may be a protective gas, the etching may begin etching the metal-containing material in addition to the metal-containing hardmask material 525. However, by incorporating a secondary precursor, the secondary precursors molecules may occupy surface area or sites along the metal-containing region 510 to form N—H bonds and/or W—H bonds in the scenario of a tungsten metal-containing region, which may reduce etch rates. For example, although fluorine or other halogens may continue to bond with the metal-containing region 510 at discreet locations, these locations may be at least partially blocked by the secondary precursor. Exemplary metals, such as molybdenum or tungsten, may not have one-to-one removal characteristics with fluorine or other halogen, and instead, three, four, or six fluorine or other halogen atoms may be incorporated prior to removal of the metal atoms. Accordingly, by utilizing the protective secondary precursor, these interactions between the fluorine and the metal may be controlled, reduced, or limited, which may facilitate control of the etch rate.

However, as the flow rate ratio of the secondary precursor increases relative to the etchant precursor, the etch rate may continue to reduce, and eventually the secondary precursor molecules will interrupt the etch process at each location on the substrate 505, preventing further etch of the metal-containing hardmask material 525. Accordingly, in some embodiments a flow rate ratio of the etchant precursor to the secondary precursor may be maintained at less than or about 2:1, which may ensure an amount of etch proceeds of the metal-containing hardmask material 525 without etching other materials on the substrate 505. For example, the flow rate ratio of the etchant precursor to the secondary precursor may be maintained at less than or about 1.9:1, and may be maintained at less than or about 1.8:1, less than or about 1.7:1, less than or about 1.6:1, less than or about 1.5:1, less than or about 1.4:1, less than or about 1.3:1, less than or about 1.2:1, less than or about 1.1:1, less than or about 1.0:1, less than or about 0.9:1, less than or about 0.8:1, less than or about 0.7:1, or less. Additionally, a first flow rate ratio may be used, and may be adjusted as the etch process proceeds to a second flow rate ratio different from the first as the etch process proceeds. Any of the noted ratios, or any ratio encompassed within the ranges listed may be used for either the first flow rate ratio or the second flow rate ratio in some embodiments during the flowing operations.

As a non-limiting example, during the contacting of the substrate 505 with the etchant precursor at operation 415, nitrogen trifluoride ($NF_3$) may readily donate a fluorine atom or two and/or a nitrogen atom at elevated temperatures, and accept a nitrogen atom, such as from the titanium nitride (TiN) or tungsten doped carbide (WDC), and be maintained in a gas phase. Accordingly, metal-containing materials, such as titanium-containing materials, may be developed as reaction byproducts, which may be gas molecules and may be pumped or removed from the processing chamber. For example, when the metal-containing hardmask material 525 is titanium nitride, fluorine from the etchant precursor may combine with the titanium nitride to form titanium tetrafluoride ($TiF_4$), titanium(III) fluoride ($TiF_3$), titanium oxyfluoride ($TiOF_2$), or any other titanium-containing materials. Additionally, nitrogen-containing materials may be developed as reaction byproducts, which may be gas molecules and may be pumped or removed from the processing chamber. For example, nitrogen from the titanium nitride may form stable byproducts such as diatomic nitrogen ($N_2$), nitrous oxide ($N_2O$), or nitrogen dioxide ($NO_2$). Accordingly, the process may remove titanium nitride or other metal-containing hardmask materials 525 under processing conditions configured to exchange fluorine and nitrogen between the etchant precursor and the metal-containing hardmask materials 525, which may produce volatile byproducts. Because of the controlled delivery and processing, fluorine-containing materials, other etchant precursors and/or secondary precursors may not etch or may minimally interact with other exposed surfaces, while readily removing metal-containing hardmask materials 525, such as titanium nitride (TiN) or tungsten doped carbide (WDC), which may produce enhanced selectivity over conventional techniques.

Processing conditions may impact and facilitate etching according to the present technology. Because the etch reaction may proceed based on thermal dissociation of a halogen from the etchant precursor, the temperatures may be at least partially dependent on the particular halogen and/or other atoms of the etchant precursor in order to initiate dissociation. As temperature increases above or about 250° C., for example, etching begins to occur or increase, which may indicate dissociation of the precursor, and/or activation of the reaction with titanium nitride (TiN) or tungsten doped carbide (WDC). As temperature continues to increase, dissociation may be further facilitated as may the reaction with the metal-containing hardmask material 525. Accordingly, in some embodiments of the present technology, etching methods may be performed at substrate, pedestal, and/or chamber temperatures greater than or about 350° C., and may be performed at temperatures greater than or about 375° C., greater than or about 400° C., greater than or about 425° C., greater than or about 410° C., greater than or about 400° C., greater than or about 390° C., greater than or about 450° C., greater than or about 475° C., greater than or about 500° C., greater than or about 525° C., or more. The temperature may also be maintained at any temperature within these ranges, within smaller ranges encompassed by these ranges, or between any of these ranges. In some embodiments the method may be performed on substrates that may have a number of produced features, which may produce a thermal budget. In some embodiments, a greater temperature may increase etching of the metal-containing hardmask material 525. Accordingly, in some embodiments, the methods may be performed at temperatures less than or about 650° C., and may be performed at temperatures less than or about 600° C., less than or about 575° C., less than or about 550° C., less than or about 525° C., less than or about 500° C., less than or about 475° C., or less.

The pressure within the chamber may also affect the operations performed as well as affect at what temperature the etchant precursor may dissociate, such as what temperature the sulfur, oxygen, and chlorine may dissociate when thionyl chloride ($SOCl_2$) is used as the etchant precursor. Accordingly, in some embodiments the pressure may be maintained above or about 0.5 Torr, above or about 1 Torr, above or about 2 Torr, above or about 3 Torr, above or about 4 Torr, above or about 5 Torr, above or about 6 Torr, above or about 7 Torr, above or about 8 Torr, above or about 9 Torr, above or about 10 Torr, above or about 15 Torr, above or about 20 Torr, above or about 30 Torr, above or about 40 Torr, above or about 50 Torr, above or about 60 Torr, or higher. Additionally, the pressure may be maintained below or about 60 Torr, below or about 50 Torr, below or about 40 Torr, below or about 30 Torr, below or about 25 Torr, below or about 20 Torr, below or about 15 Torr, below or about 10 Torr, below or about 9 Torr, below or about 8 Torr, below or about 7 Torr, below or about 6 Torr, below or about 5 Torr, or less. The pressure may also be maintained at any pressure within these ranges, within smaller ranges encompassed by these ranges, or between any of these ranges. In some embodiments, etch amount may be facilitated and may initiate as pressure increases above about 0.5 Torr. Additionally, as pressure continues to increase, etching may improve up to a point before beginning to reduce, and eventually cease as pressure continues to increase. Without being bound to any particular theory, pressure within the chamber may affect processing with precursors described above. At low pressures, flow across a substrate may be reduced, and dissociation may similarly be reduced. As pressure increases, interactions between the etchant precursor and the substrate may increase, which may increase reactions and etch rates. However, as pressure continues to increase, recombination of the dissociated etchant precursor atoms may increase due to the relative stability of the molecules. Thus, the precursors may effectively be pumped back out of the chamber without reacting with the substrate. Additionally, interactions with the metal-containing hardmask material 525 may be suppressed as pressure continues to increase, or byproduct material may be reintroduced to the film being etched, further limiting removal. Accordingly, in some embodiments, pressure within the processing chamber may be maintained below or about 30 Torr in some embodiments.

By performing operations according to embodiments of the present technology, metal-containing hardmask material 525, such as titanium nitride (TiN), other titanium-containing materials, or tungsten doped carbide (WDC) may be etched selectively relative to other materials, including other oxides or nitrides. For example, the present technology may selectively etch metal-containing hardmask material 525 relative to exposed regions of metals, dielectrics including silicon-containing materials including silicon oxide, or other materials. Embodiments of the present technology may etch metal-containing hardmask material 525 relative to silicon oxide or any of the other materials at a rate of at least about 2:1, and may etch metal-containing hardmask material 525 relative to silicon oxide or other materials noted at a selectivity greater than or about 3:1, greater than or about 4:1, greater than or about 5:1, greater than or about 6:1, greater than or about 7:1, greater than or about 8:1, greater than or about 9:1, greater than or about 10:1, greater than or about 15:1, greater than or about 20:1, greater than or about 25:1, greater than or about 30:1, greater than or about 35:1, greater than or about 40:1, greater than or about 45:1, greater than or about 50:1, or more. For example, etching performed according to some embodiments of the present technology may etch metal-containing hardmask material 525 while substantially or essentially maintaining silicon oxide or other materials, such as nitrides or oxides of silicon, aluminum, or hafnium, metals such as tungsten or molybdenum, or materials such as polysilicon for example.

In embodiments, optional operation 425 of method 400 may include contacting the substrate with a second etchant precursor, such as a post-etching precursor, to remove fluorine-containing residue from the substrate and/or an oxidized portion of the metal-containing hardmask material 525. Prior to flowing the second etchant precursor, delivery of the etchant precursor provided at operation 410 may be halted. The fluorine-containing residue may be present on any expose surface of material on the substrate 505. The oxidized portion of the metal-containing hardmask material 525 may be resultant from the secondary precursor oxidizing the metal-containing hardmask material 525 during the etching. The second etchant precursor may be a halogen-containing precursor, and may be any precursor previously discussed with regard to operation 410. One exemplary second etchant precursor may be boron trichloride ($BCl_3$). The second etchant precursor may be provided to the processing region, may contact the substrate 505, and may remove the fluorine-containing residue from the substrate and/or an oxidized portion of the metal-containing hardmask material 525.

In embodiments, method 400 may include cycling the operations of 410-420 associated with etching the metal-containing hardmask material 525 with operation 425 to remove the fluorine-containing residue from the substrate and/or the oxidized portion of the metal-containing hardmask material 525. By cycling operations 410-420 and 425, the metal-containing hardmask material 525 may be removed while any fluorine-containing residue and/or the oxidized portion of the metal-containing hardmask material 525 may be minimized/eliminated to allow the etching to proceed.

Each operation of method 400 may be performed in a single processing region of a single semiconductor processing chamber. However, it is also contemplated that the substrate 505 may be transferred between various processing regions to increase throughput. For example, operation 405 may be performed in a first processing region of a first semiconductor processing chamber, and operations 410-425 may be performed in a second processing region of a second semiconductor processing chamber. In further embodiments, operations 410-420 may be performed in the second processing region of the second semiconductor processing chamber, and operation 425 may be performed in a third processing region of a third semiconductor processing chamber.

Selectivity may be based in part on precursors used and the ability to dissociate at more controlled temperature ranges. Conventional technologies may be incapable of producing etch selectivity of embodiments of the present technology. Similarly, because wet etchants readily remove silicon oxide, wet etchants may also be incapable of etching selectively at rates comparable to embodiments of the present technology. The previously discussed methods may allow the removal of metal-containing hardmask materials, such as titanium-containing materials, relative to a number of other exposed materials. By utilizing etchants at operating conditions as previously described, improved etching of metal-containing hardmask materials, such as titanium nitride (TiN) or tungsten doped carbide (WDC), may be performed, which may both increase selectivity over conventional techniques, as well as improve etching access in small pitch features.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the material" includes reference to one or more materials and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:
   flowing an etchant precursor into a processing region of a semiconductor processing chamber, wherein a substrate is housed within the processing region, and wherein the substrate defines an exposed region of a metal-containing hardmask material, an exposed region of a metal material, and an exposed region of a material characterized by a dielectric constant of less than or about 4.0;
   contacting the substrate with the etchant precursor; and
   removing at least a portion of the metal-containing hardmask material.

2. The semiconductor processing method of claim 1, wherein the etchant precursor comprises a halogen-containing precursor.

3. The semiconductor processing method of claim 1, wherein the etchant precursor comprises nitrogen trifluoride ($NF_3$), diatomic fluorine ($F_2$), diatomic chlorine ($Cl_2$), thionyl chloride ($SOCl_2$), carbon tetrafluoride ($CF_4$), hexafluoroethane ($C_2F_6$), sulfur hexafluoride ($SF_6$), carbon tetrachloride ($CCl_4$), dichloromethane ($CH_2Cl_2$), chloroform ($CHCl_3$), or a combination thereof.

4. The semiconductor processing method of claim 1, wherein the etchant precursor comprises nitrogen trifluoride ($NF_3$).

5. The semiconductor processing method of claim 1, further comprising:
   flowing a hydrogen-containing precursor or an oxygen-containing precursor to the processing region of the semiconductor processing chamber with the etchant precursor.

6. The semiconductor processing method of claim 1, wherein removing the portion of the metal-containing hardmask material is performed plasma-free.

7. The semiconductor processing method of claim 1, wherein removing the portion of the metal-containing hardmask material is performed at a temperature greater than or about 350° C.

8. The semiconductor processing method of claim 1, wherein removing the portion of the metal-containing hardmask material is performed at a pressure greater than or about 2 Torr.

9. The semiconductor processing method of claim 1, further comprising:
   prior to flowing the etchant precursor into the processing region of the semiconductor processing chamber, removing an oxidized portion of the metal-containing hardmask material.

10. The semiconductor processing method of claim 1, further comprising:
   subsequent to removing the portion of the metal-containing hardmask material, contacting the substrate with a second etchant precursor to remove fluorine-containing residue from the substrate or an oxidized portion of the metal-containing hardmask material.

11. The semiconductor processing method of claim 1, wherein the metal-containing hardmask material is a titanium-containing hardmask material.

12. The semiconductor processing method of claim 1, wherein the metal-containing hardmask material includes doped carbide.

13. A semiconductor processing method comprising:
   flowing a pre-etching precursor into a processing region of a semiconductor processing chamber, wherein a substrate is housed within the processing region, and wherein the substrate defines an exposed region of a metal-and-nitrogen-containing hardmask material, an exposed region of a metal-containing material, and an exposed region of a material characterized by a dielectric constant of less than or about 4.0;
   contacting the substrate with the pre-etching precursor to at least partially oxidize the exposed region of the metal-containing material;
   halting delivery of the pre-etching precursor;
   flowing an etchant precursor into the processing region of the semiconductor processing chamber;
   contacting the substrate with the etchant precursor; and
   selectively removing at least a portion of the metal-and-nitrogen-containing hardmask material relative to the material characterized by the dielectric constant of less than or about 4.0.

14. The semiconductor processing method of claim 13, wherein the pre-etching precursor comprises nitrogen trifluoride ($NF_3$), tungsten hexafluoride ($WF_6$), or boron trichloride ($BCl_3$).

15. The semiconductor processing method of claim 13, further comprising:
   forming plasma effluents of the pre-etching precursor.

16. The semiconductor processing method of claim 13, wherein the etchant precursor comprises nitrogen trifluoride ($NF_3$), diatomic fluorine ($F_2$), diatomic chlorine ($Cl_2$), thionyl chloride ($SOCl_2$), carbon tetrafluoride ($CF_4$), hexafluoroethane ($C_2F_6$), sulfur hexafluoride ($SF_6$), carbon tetrachloride ($CCl_4$), dichloromethane ($CH_2Cl_2$), chloroform ($CHCl_3$), or a combination thereof.

17. The semiconductor processing method of claim 13, wherein removing the portion of the metal-and-nitrogen-containing hardmask material is performed plasma-free.

18. The semiconductor processing method of claim 13, wherein the metal-containing material is a metal material.

19. A semiconductor processing method comprising:
   flowing an etchant precursor into a processing region of a semiconductor processing chamber, wherein a substrate is housed within the processing region, and wherein the substrate defines an exposed region of a metal-containing hardmask material;
   contacting the substrate with the etchant precursor;
   removing at least a portion of the metal-containing hardmask material relative to one or more other materials on the substrate;
   halting delivery of the etchant precursor;
   flowing a post-etching precursor into the processing region of the semiconductor processing chamber;
   contacting the substrate with the post-etching precursor; and
   removing a fluorine-containing residue from the substrate.

20. The semiconductor processing method of claim 19, wherein the etchant precursor comprises a halogen-containing precursor.

21. The semiconductor processing method of claim 20, wherein the one or more other materials on the substrate comprise a dielectric constant of less than or about 4.0, a metal material, a silicon-containing material, or a metal-and-oxygen-containing material.

22. The semiconductor processing method of claim 19, wherein removing the portion of the metal-containing hard-mask material is performed at a temperature greater than or about 350° C. and at a pressure greater than or about 2 Torr.

\* \* \* \* \*